United States Patent [19]

Murakoshi et al.

[11] Patent Number: 5,640,020

[45] Date of Patent: Jun. 17, 1997

[54] ION GENERATION DEVICE, ION IRRADIATION DEVICE, AND METHOD OF MANUFACTURING A SEMICONDUCTOR DEVICE

[75] Inventors: Atsushi Murakoshi, Kawasaki; Kyoichi Suguro, Yokohama; Tatsuya Hatanaka, Ichikawa, all of Japan

[73] Assignee: Kabushiki Kaisha Toshiba, Kawasaki, Japan

[21] Appl. No.: 713,123

[22] Filed: Sep. 16, 1996

Related U.S. Application Data

[63] Continuation of Ser. No. 560,029, Nov. 17, 1995.

[30] Foreign Application Priority Data

Nov. 18, 1994 [JP] Japan .................................. 6-283904
Sep. 18, 1995 [JP] Japan .................................. 7-238879
Nov. 14, 1995 [JP] Japan .................................. 7-295768

[51] Int. Cl.$^6$ ..................................................... H01J 3/02
[52] U.S. Cl. ...................... 250/492.21; 250/423 R; 250/426; 250/427; 315/111.81; 313/231.41
[58] Field of Search ..................... 250/492.21, 492.22, 250/492.3, 426, 424, 423 R, 427; 315/111.81; 913/362.1, 230, 231.41, 231.71

[56] References Cited

U.S. PATENT DOCUMENTS 5,089,746  2/1992  Rosenblum et al. ............... 250/423 R Primary Examiner—Jack I. Berman
Assistant Examiner—Kiet T. Nguyen
Attorney, Agent, or Firm—Oblon, Spivak, McClelland, Maier & Neustadt, P.C.

[57] ABSTRACT

An ion generation device includes a chamber in which plasma is generated, a first opening for introducing gas to be ionized by the plasma, and a second opening for irradiating ions generated from the gas. The inner wall of the chamber is coated with metal which is resistant to chemical etching by the ions and radicals.

23 Claims, 7 Drawing Sheets

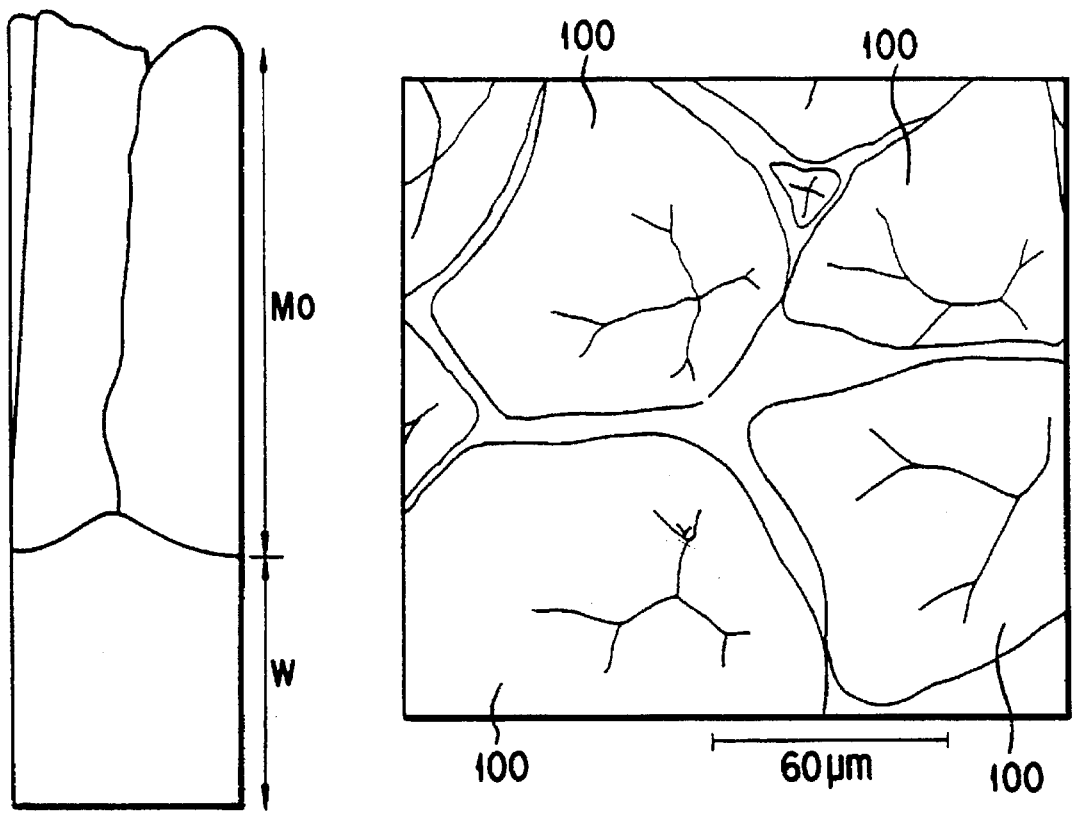
F I G. 6A
(PRIOR ART)
F I G. 6B
(PRIOR ART)
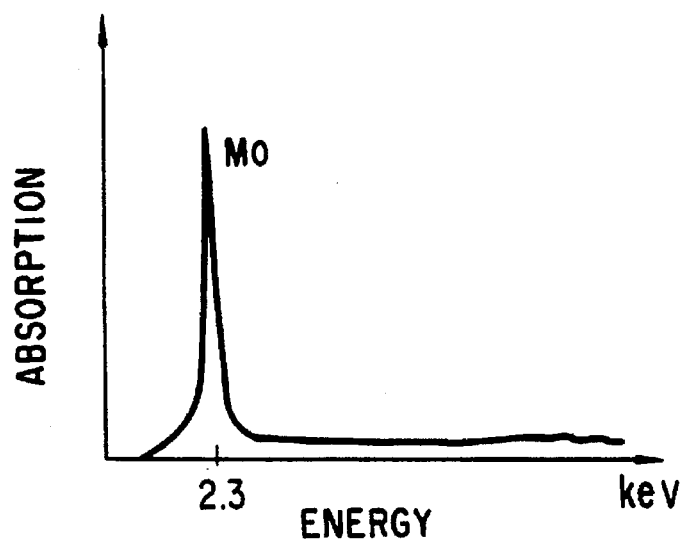
F I G. 6C
(PRIOR ART)

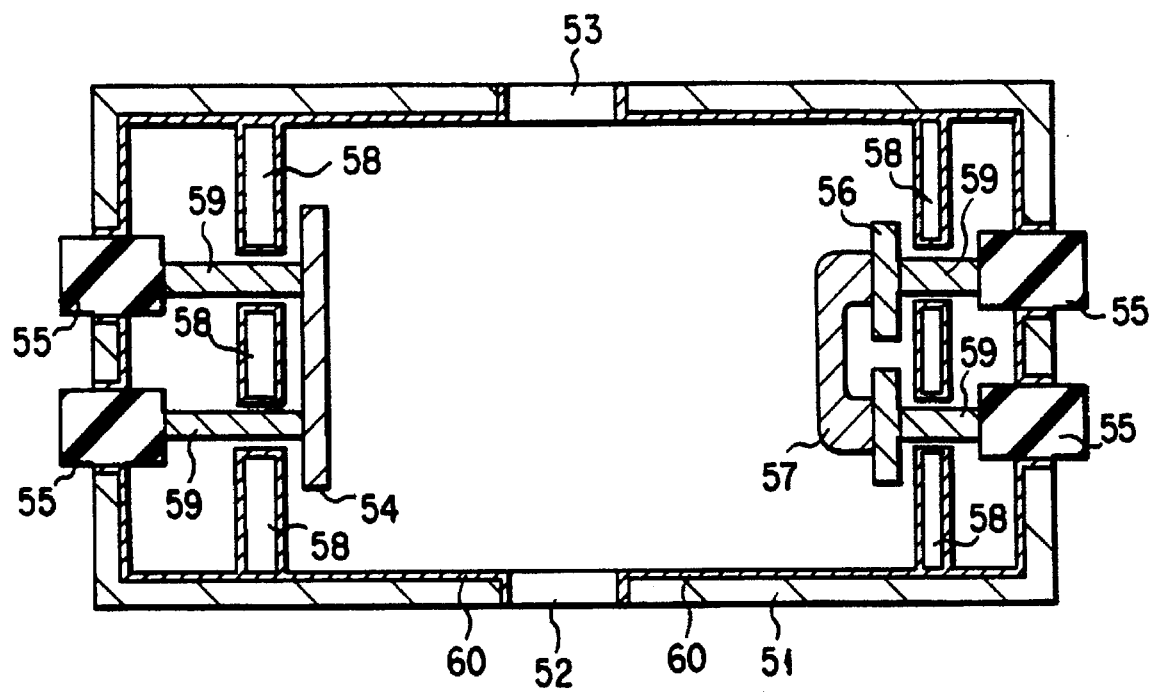
F I G. 7
F I G. 8
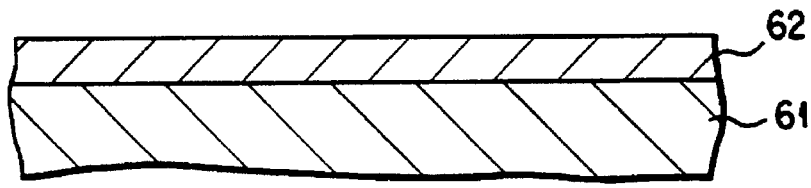
F I G. 9

ION GENERATION DEVICE, ION IRRADIATION DEVICE, AND METHOD OF MANUFACTURING A SEMICONDUCTOR DEVICE

This is a Continuation of application Ser. No. 08/560,029 filed on Nov. 17, 1995.

BACKGROUND OF THE INVENTION

1. Field of the Invention

The present invention relates to an ion generation device for generating ions from gas or vapor by plasma, an ion irradiation device, and a method of manufacturing a semiconductor device.

2. Description of the Related Art

Ion implantation has recently been employed as a method of forming a pn junction by adding impurities such as boron (B) and phosphorus (P) to a semiconductor substrate. The ion implantation makes it possible to accurately control the concentration and depth of impurities to be diffused into a target spot.

FIG. 1 is a block diagram illustrating the constitution of a prior art ion irradiation device. The constitution will now be described in brief.

In the prior art ion irradiation device, an ion source chamber 1 generates ions. The ions are drawn by drawing electrodes 2 and their mass is analyzed by a separating electromagnet 3. Then the ions are completely separated by slits 4 and accelerated by accelerators 5 to the final energy. A beam of the ions is converged on the face of a sample 12 by a quadrupole lens and scanned by scanning electrodes 7 and 8 such that it is uniformly distributed onto the entire face of the sample 12. Deflection electrodes 9 are designed to deflect the ion beam in order to eliminate uncharged particles caused by collision with residual gas.

The ion source chamber 1 is the heart of the ion irradiation device (including an ion generation device). As the chamber 1, there are a Freeman type ion source chamber using thermoelectrodes, a Bernas type ion source chamber, and a microwave type ion source chamber using magnetron.

FIG. 2 is a cross-sectional view of a Freeman type ion source chamber 23. According to this chamber, plasma is generated by emitting thermoelectrons from a bar-shaped filament 22, an electric field is generated in parallel to the filament 22 by an electromagnet 21, a rotating field is caused by filament current, and electrons are complicatedly moved in the chamber 23 by a reflector 25, thereby improving in efficiency in ionization. The ions generated by the chamber 23 pass through a slit and are guided in a direction perpendicular to the filament 22.

FIG. 3 is a cross-sectional view of a Bernas type arc chamber 31 containing molybdenum (Mo) as the main ingredient. The chamber 31 includes a tungsten (W) filament 37 and its opposing electrode 34. The chamber is supplied with $BF_3$ gas from a gas line 32 and emits thermoelectrons from the filament 37, with the result that the $BF_3$ gas is discharged and ionized.

FIG. 4 is a cross-sectional view of a microwave ion source chamber. In this chamber, plasma is generated in a discharge box 43 using a microwave caused by a magnetron 41. Since the chamber has no filaments, its lifetime is not shortened even by the use of reactive gas or it is not contaminated with alkali metal. However, metal as well as ions is extracted from the chamber and attracted to the surface of a drawing electrode 44; therefore, a desired voltage cannot be applied or the metal or ions may reach a sample to contaminate it.

To resolve the above problems, an ion source chamber for applying carbon (C) onto the inner wall of the chamber containing molybdenum (Mo) has been manufactured experimentally. Gases such as $BF_3$ and $PF_3$ has been conventionally employed in the above conventional devices. These gases are ionized in the chamber to be implanted into source and drain regions serving as samples. In a compound semiconductor device, too, silicon (Si) is ion-implanted and, in this case, $SiF_4$ is used as source gas.

Ion implantation of germanium (Ge) has recently been studied in order to render a semiconductor substrate serving as a sample amorphous. In the Ge ion implantation, $GeH_4$ gas (germane gas) has been employed; however, it reacts upon oxygen drastically, which causes security problems. Thus, $GeF_4$ is nowadays used as source gas.

If the above-described Freeman type chamber is used for a long time, the filament is increased in resistance and finally disconnected, with the result that no ions can be generated. Moreover, the chamber is not discharged because of conduction of the chamber and filament to be insulated by a supporting insulation member.

According to the foregoing Bernas type arc chamber, the molybdenum (Mo) on the inner wall of the chamber is etched by fluorine ions, radicals or the like produced by ionization of $BF_3$, and the molybdenum (Mo) is etched and removed from the inner wall. The removed molybdenum absorbs on the tungsten filament 37 and electrode 34 and grown by thermal reaction into an alloy of W and Mo. In this case, the thermoelectrons are prevented from being emitted from the alloy region of the filament 37 and supplied only to that region thereof on which no molybdenum (Mo) absorbs, with the result that the filament 37 is locally used up and finally disconnected.

The disconnection of a tungsten filament used for about 20 hours will be explained referring to FIGS. 5A to 5C. Of these figures, FIG. 5A shows an unused tungsten filament, FIG. 5B does the surface of the tungsten filament when it is used for three days, and FIG. 5C is a graph showing the results of observation and composition analysis of a disconnected region of the filament. As shown in FIG. 5B, a foreign substance is included in a region of the filament where no disconnection occurs. It is turned out from the composition analysis that the foreign substance is an alloy of the tungsten (W) filament and molybdenum (Mo) absorbing thereon. In contrast, it is apparent from FIG. 6B that no foreign substance is present in a disconnected region of the filament and the filament is finely formed. In the region containing the foreign substance, the composition ratio of W to Mo is 26 wt % to 74 wt %, that is, the principal ingredient of the substance is molybdenum, while in the region containing no foreign substance, the composition ratio of W to Mo is 87 wt % to 13 wt %.

Furthermore, the microwave ion source chamber has the drawback wherein carbon (C) is removed from the surface of the chamber and absorbs on the filament or a sample is contaminated with the carbon.

In the prior art ion source chambers described above, a filament is disconnected or a supporting insulation member deteriorates in insulation properties to shorten the lifetime thereof, a semiconductor substrate is contaminated, and the like.

SUMMARY OF THE INVENTION

It is accordingly an object of the present invention to provide an ion generation device, an ion irradiation device, and a method of manufacturing a semiconductor device, which are capable of lengthening the lifetime thereof and preventing a sample from being contaminated.

The inventors of the present invention considered the foregoing drawbacks of the prior art and have come to the following conclusion.

In an etching device wherein the density of plasma is high only in the vicinity of a substrate to be processed, molybdenum is chemically etched. However, it has been believed that there are relatively fewer cases where molybdenum of the inner wall of a chamber is etched by reacting upon ion or radical in the chamber, such as an ion generation device, in which the inner wall is exposed and the density of plasma is low. However, the inventors carried out the following experiment in order to find problems due to the chemical etching.

The surface of the filament used for thirty hours in an Nb-coated chamber of an ion generating device supplied with GeF gas is shown in FIG. 5A (left side) which has been already used for the explanation of the related art. It is apparent from this figure that no substance is attached to the surface of the filament and thus no reaction occurs between tungsten (W) and niobium (Nb).

The graph of FIG. 5A (right side) shows the results of surface analysis by measuring energy incident upon the filament and number of absorption waves. As is apparent from FIG. 5C, when the incident energy reacting upon the tungsten (W) of the filament is 8.4 keV, there occurs absorption and, when the incident energy reacting upon the niobium (Nb) is 2.3 keV, there occurs no absorption. It is thus understood that there would occur no reaction on the surface of the filament.

This is the point to which the inventors of the present invention directed their attention. That is, the above problems are resolved by coating the inner wall of the chamber with Nb which has a lower melting point, in which a compound of the Nb and halogen has a lower pressure.

FIG. 6A is cross-sectional view of the filament of the conventional Freeman ion source whose chamber is constituted of molybdenum. This filament was used for about twenty hours in the chamber supplied with $GeF_4$ gas. It is seen from FIG. 6A that the molybdenum adsorbs on the surface of the filament and grows by thermal reaction. The growth of molybdenum is seen from particles 100 of the molybdenum shown in FIG. 6B and the relationship between the incident energy and absorption waves as shown in FIG. 6C.

The growth of molybdenum appears to be caused by the fact that the molybdenum is etched and removed from the inner wall by chemical reaction upon fluorine ions and radicals in the plasma, and adsorbs on the filament.

Furthermore, the inventors acquired the following results from the above experiment.

It turned out that the removal of molybdenum (Mo) occurred in using a prior art chamber for introducing $BF_3$ gas to implant boron ions to a sample, though it did not do more heavily than that of $GeF_4$. While the lifetime of a filament in a chamber introducing $BF_3$ gas was about three months, that of a filament in a chamber introducing $GeF_4$ gas was about three weeks.

It also turned out that since molybdenum was removed even when $BF_3$ gas was used, the lifetime of a chamber was shortened by adsorption of the removed molybdenum to the filament or supporting insulation member or a sample was contaminated with the removed molybdenum. These problems became more serious when $GeF_4$ gas is introduced.

The inventors understood that it was the property of $GeF_4$ itself that made the above problems more serious. One reason is as follows. Three fluorine (F) radicals or ions are generated from $BF_3$, while four fluorine radicals or ions are done from $GeF_4$. It is thought that such a larger number of F radicals or F ions reacts upon a large amount of molybdenum thereby to acceleratedly shorten the lifetime of a chamber. This theory seems applicable to $SiF_4$.

Another reason is a difference in ionizing efficiency between $GeF_4$ and $BF_3$. More specifically, the electronegativity of Ge is 1.8 and that of F is 4.0, and thus the difference therebetween is 2.2, while the electronegativity of B is 2.0 and thus the difference between B and F is 2.0. The wider the difference in electronegativity, the higher the ionizing efficiency; thus, molybdenum is easier to remove and fluorine radicals or ions are easier to generate in the chamber using $GeF_4$ gas. A large amount of halogen is therefore generated in the chamber. This theory can be applied to Si the electronegative of which is 1.8.

The same problems as above arise in using $PF_3$ gas, though they are not more serious than in using $GeF_4$ gas. However, it is evident from the experiment that the problems can be resolved if the foregoing material is selected for the inner wall of a chamber in view of chemical etching.

The surface of a filament in a chamber having a Nb-coated inner wall in the ion generation device which was used for thirty hours, and the results of surface analysis obtained by measuring energy incident upon the filament and absorption therein, are also shown in FIG. 5A.

By resolving the above-described problems, the removal of materials of the inner wall can be prevented and so can be the absorption thereof in the filament. Moreover, a defect in insulation due to attachment of the materials to a supporting insulation member, as can be contamination of a sample outside the chamber.

A supporting insulation member 76 (see FIG. 15) is spaced away from a plasma generation area and thus hard to directly expose to plasma. It is thus possible to prevent the materials of a filament from being attached to the supporting insulation member even when the filament is used for a long time.

In contrast, if a supporting insulation member 26 shown in FIG. 2 is used for a long time while being exposed to plasma, metallic materials are separated from the inner wall of the chamber and filament 22 and attached onto the surface of the member 26, resulting in bad insulation.

In the conventional microwave ion source, too, the molybdenum inner wall of the chamber, which is exposed to plasma, is etched by ions or radicals by chemical reaction, and the molybdenum is separated from the inner wall. The molybdenum is then removed from the chamber along with the ions and absorbs on the surface of the drawing electrode 44. As a result, a desired voltage cannot be applied or a sample is contaminated with the molybdenum.

According to present invention, by resolving the above problems, the etching of metallic materials are suppressed by virtue of reaction on the ions or radicals. It is thus possible to prevent the separated metallic materials from being attached to the filament and drawing electrode and also to prevent a sample from being contaminated with the metallic materials.

According to a first aspect of the present invention, there is provided an ion generation device comprises a chamber in which plasma is generated; a first opening, provided in the chamber, for introducing gas to be ionized by the plasma; and a second opening for irradiating ions generated from the gas, wherein at least an inner wall of the chamber is made of metal which is resistant to chemical etching by the ions and radicals.

It is desirable that the gas be a compound including halogen.

The ion generation device of the present invention is very effective in using $GeF_4$, $SiF_4$, $BF_3$, $PF_3$, and $AsF_3$ as the gas. Among them, $SiF_4$ and $GeF_4$ produce remarkable effects.

The chamber is provided with a filament for generating plasma by emitting thermoelectrons. It is desirable that at least a surface of the filament be made of at least one metal used in the wall of the channels.

It is desirable that a compound of the metal of the inner wall and halogen has a vapor pressure which is lower than that of a compound of the filament and halogen.

It is desirable that the metal material have a melting point which is higher than an inside temperature of the chamber.

Specifically, it is desirable that the metal material contain at least one of V, Nb, Ta, Cr, Ti, Zr, Hf and Pt as a principal ingredient, and it is more desirable to use at least one of Va-family elements of V, Nb and Ta as the principal ingredient.

Moreover, when the inner wall of the chamber is coated with the metal material, it is desirable to provide a barrier metal between the chamber and metal material to prevent the material of the chamber from being seeped from the surface of the metal. It is then desirable to form Ti/TiN as the barrier metal. Also it is desirable that the uppermost surface of the metal material be coated with nitride. The nitride can be obtained by nitriding the uppermost surface of the metal material.

When the chamber contains molybdenum and the gas includes fluorine, it is desirable that a compound of the metal material and fluorine have a vapor pressure which is lower than that of $MoF_6$.

It is desirable that the inner wall of the chamber is coated with the metal which is resistant to chemical etching by the ions and radicals.

Furthermore, the ion generation device further comprises a supporting insulation member for supporting the filament. It is desirable that the supporting insulation member is separated from a generation area of the plasma. A spacer is provided between the supporting insulation member and the filament. In this case, it is desirable that the supporting insulation member is separated from the generation area of the plasma by leaving a space between the spacer and at least one of the filament and the inner wall of the chamber.

It is desirable that at least a surface of the spacer be made of at least one metal used in the wall of the chamber.

It is desirable that the foregoing ion generation device be of a Freeman type or a Bernas type.

It is desirable to employ noble metal or transition metal, which is resistant to plasma containing fluorine, in an ion source for generating ions by electric arc discharge, especially an area to be exposed to the plasma. Thus, backward sputtering onto the filament and poor insulation of the supporting insulation member can be suppressed, with the result that the lifetime of the ion source can be lengthened and the ion implantation can stably be achieved.

According to a second aspect of the present invention, there is provided an ion irradiation device comprising an ion generation section including a chamber in which plasma is generated, a first opening, provided in the chamber, for introducing gas from which ions are generated by the plasma, and a second opening for irradiating the ions, at least an inner wall of the chamber being made of metal which is resistant to chemical etching due to the ions and radicals; and a sample chamber provided outside the chamber and including a sample so as to irradiate the ions from the second opening.

According to a third aspect of the present invention, there is provided a method of manufacturing a semiconductor device comprising the steps of introducing gas into a first chamber; generating ions from the gas by plasma generated in the first chamber; emitting the ions from the first chamber; and irradiating the ions onto a sample provided in a second chamber, wherein at least an inner wall of the first chamber is made of metal which is resistant to chemical etching due to the ions and radicals.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 6A to 6C are views showing a filament is observed and analyzed to explain the prior art ion sources;

FIG. 7 is a cross-sectional view showing the constitution of a Bernas type ion source (ion generation device) according to a first embodiment of the present invention;

FIG. 8 is a cross-sectional view showing the wall structure of a commonly-used ion source;

FIG. 9 is a cross-sectional view of the first wall structure of the ion source shown in FIG. 7;

DETAILED DESCRIPTION OF THE PREFERRED EMBODIMENTS

Figure 1:
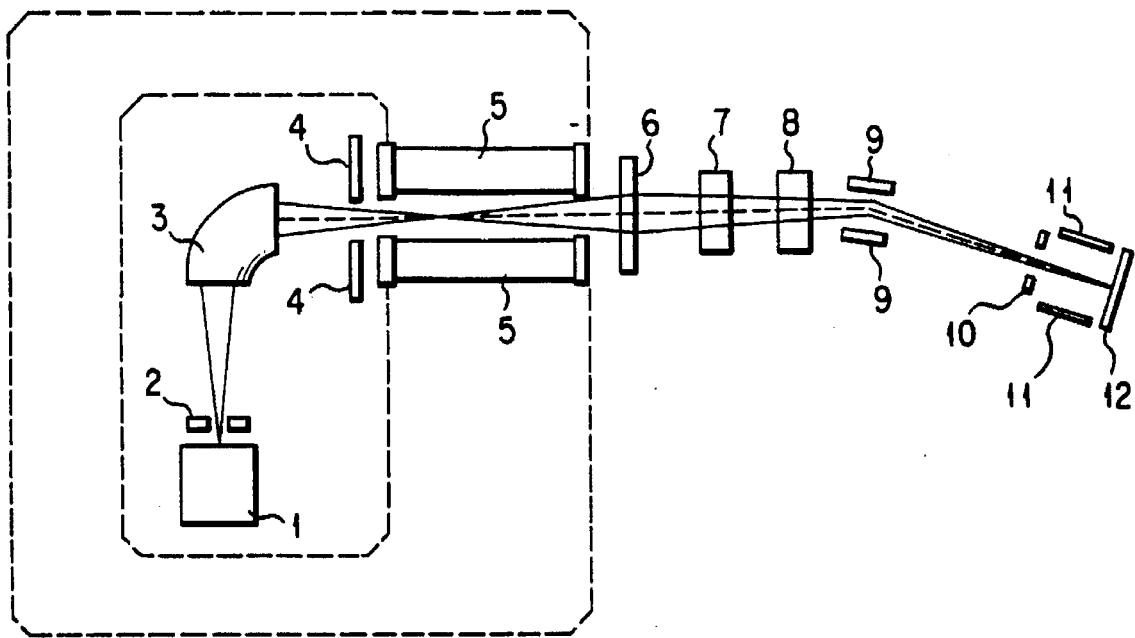
FIG. 1 is a cross-sectional view showing the constitution of a prior art ion irradiation device.
Figure 2:
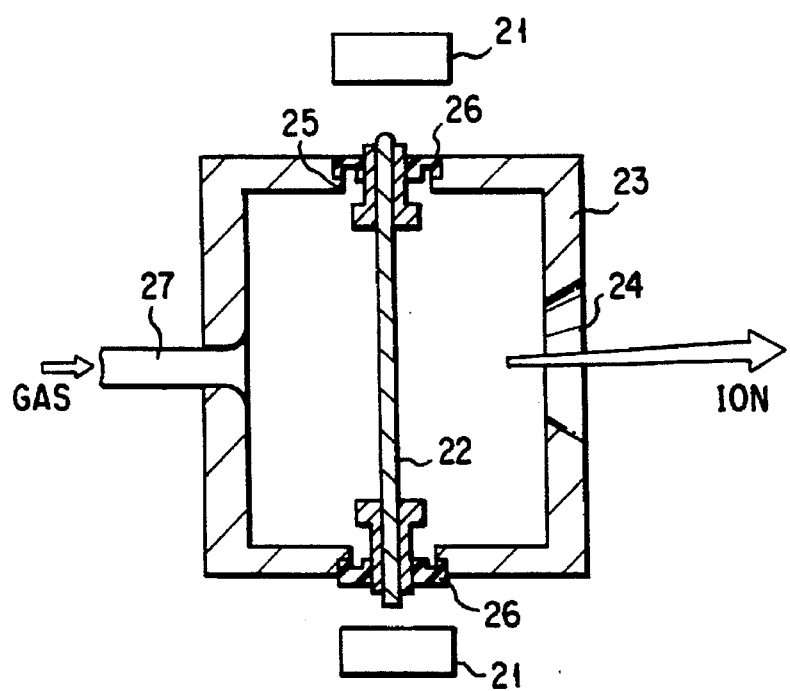
FIG. 2 is a cross-sectional view showing the constitution of a prior art Freeman type ion source.
Figure 3:
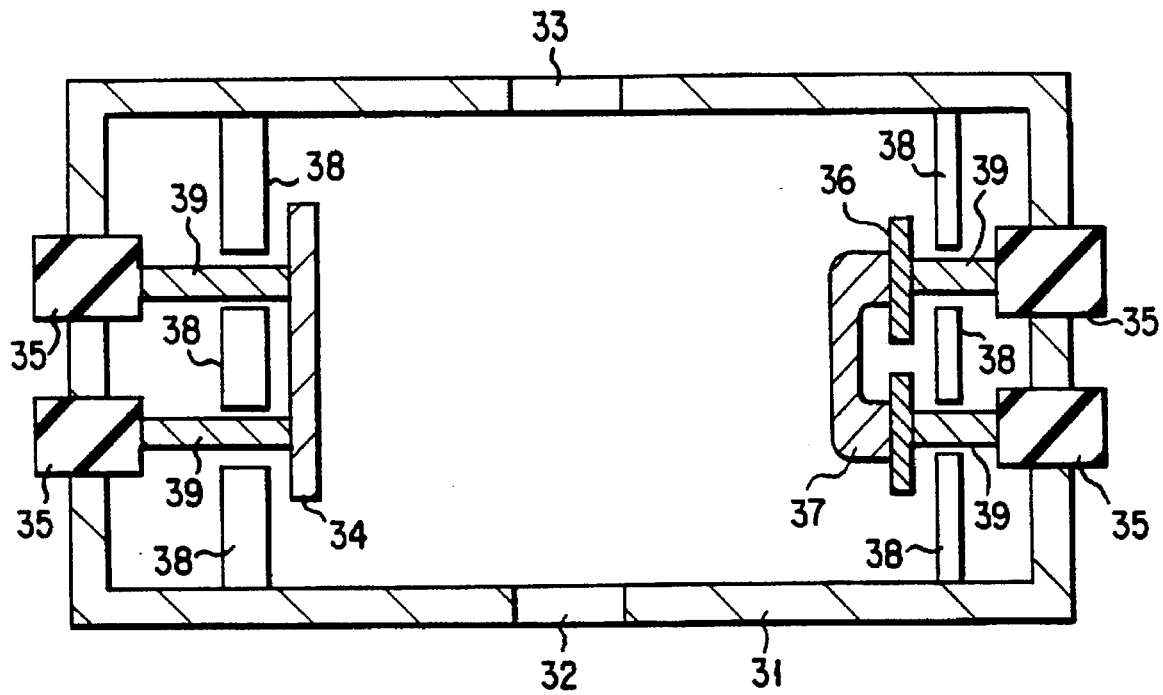
FIG. 3 is a cross-sectional view showing the constitution of a prior art Bernas type ion source.
Figure 4:
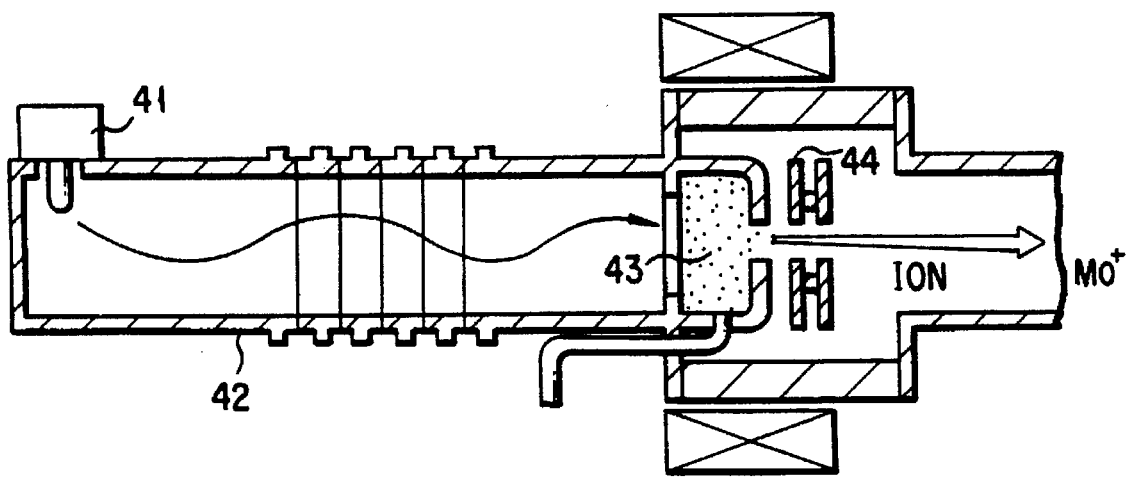
FIG. 4 is a cross-sectional view showing the constitution of a prior art microwave ion source.
Figure 5A:
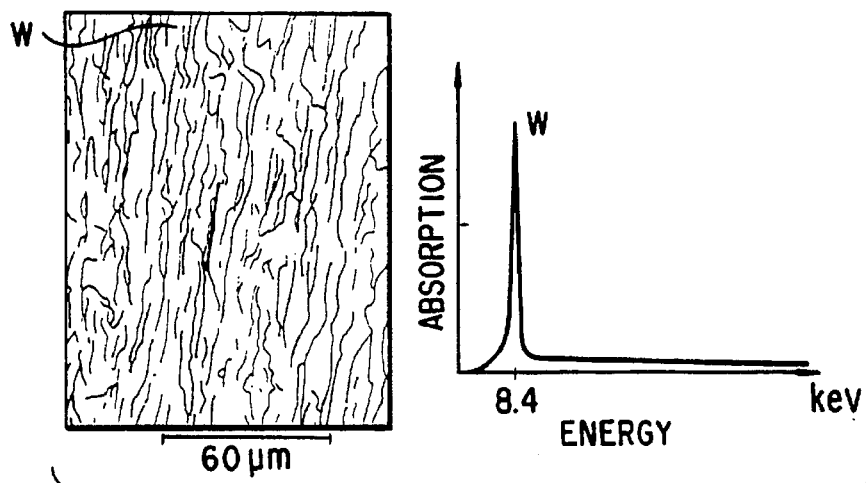
FIGS. 5A to 5C are views showing a filament observed and analyzed to explain the prior art ion sources.
Figure 5B:
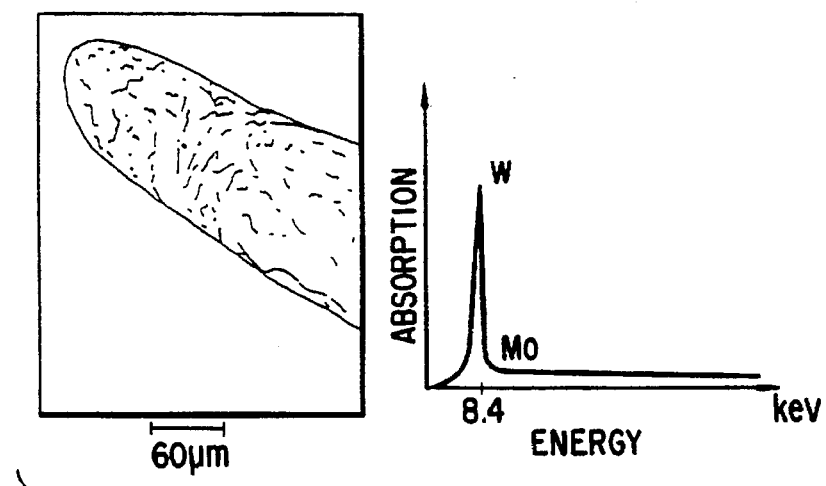
Figure 5C:
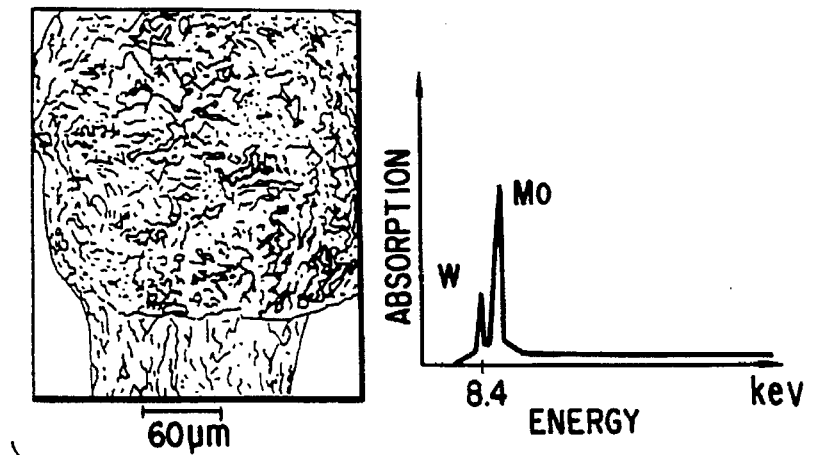

Embodiments of the present invention will now be described with reference to the accompanying drawings.

In order to eliminate the problems of etching and depositing molybdenum (Mo) in the prior art ion source, the surface of an ion source, which is exposed to plasma including halogen, has to be covered with Va-family metal (V, Nb, Ta) or noble metal (Ni, Pt, Pb), or the wall of the ion source has to be constituted by one of these metals or an alloy containing one of them as the main ingredient. It is desirable to use the Va-family metal whose melting point is higher than that of the noble metal when the inside temperature of the ion source is 900° C. or higher. The prior art problems can be resolved by the embodiments of the present invention.

First Embodiment

FIG. 7 illustrates an example of a Bernas type ion source (ion generation device) according to the first embodiment of the present invention. A TiN film of 100 nm and a Ti film of 50 nm are formed by sputtering on an arc chamber 51 whose principal ingredient is molybdenum (Mo) (the TiN film is formed on the Ti film), an niobium (Nb) film of 3 µm is formed by sputtering using an argon (Ar) gas, and an NbN film 60 of 1 µm is coated thereon by sputtering in the one-to-one ratio of Ar gas to $N_2$ gas. The arc chamber 51 includes a tungsten filament 57 and filament supporting members 55 constituted of molybdenum. The supporting members 55 are not exposed to plasma generated in the arc chamber 51 because barrier walls 58 are provided. In this case, filament stands 56, 59 pass through the barrier walls 58. It is desirable that the barrier walls 58 is constituted of molybdenum and the surface thereof are coated to suppress chemical etching due to halogen, as shown in FIG. 7 of this embodiment.

$BF_3$ gas is supplied to the arc chamber 51 through a gas line 52, and the tungsten filament 57 emits thermoelectrons, thereby discharging the $BF_3$ gas and ionizing them.

Figure 10:
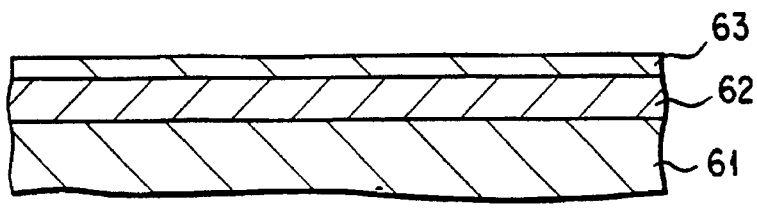
FIG. 10 is a cross-sectional view of the second wall structure of the ion source shown in FIG. 7.

The wall structure of a commonly-used ion source is shown in FIG. 8, and the basic wall structures of the ion source of the present invention are illustrated in FIGS. 9 to 14. The wall of the ion source as shown in FIG. 8 is constituted of molybdenum 61. In contrast, as shown in FIG. 9, a Va-group metal (V, Nb, Ta) film 62, which is chemically resistant to halogen, especially fluorine, is coated on the surface of molybdenum 61 and therefore the molybdenum is not etched at all. To cover the film 62 with a metal nitride 63, as shown in FIG. 10, is effective in reducing in chemical etching speed.

Figure 11:
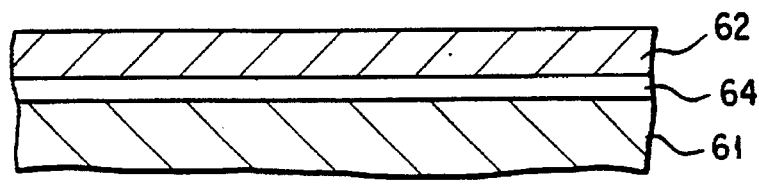
FIG. 11 is a cross-sectional view of the third wall structure of the ion source shown in FIG. 7.
Figure 12:
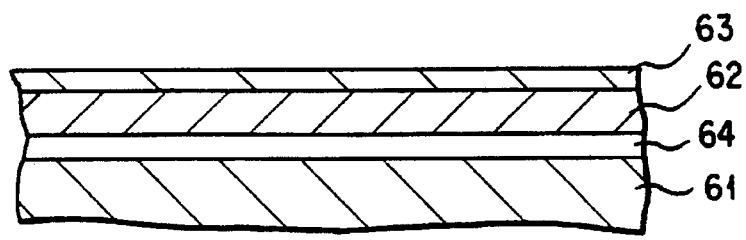
FIG. 12 is a cross-sectional view of the fourth wall structure of the ion source shown in FIG. 7.

If the inside temperature of the ion source rises to 1000° C. or higher (specifically, to 1500° C. or higher), there occurs a problem wherein the molybdenum 61 reacts upon the Va-family metal to be seeped from the surface of the film 62. To resolve this problem, as shown in FIGS. 11 and 12, it is effective to provide a reaction preventing layer 64 in the interface between the molybdenum and Va-family metal, and a metal nitride such as TiN, TaN and NbN can be used therefor. Si, C or Ge can be included in the metal nitride to stabilize the wall structure even at a high temperature.

In order to enhance the adhesion between the molybdenum and metal nitride, a metal film, which is thinner than the metal nitride, can be formed in the interface, and Ti, Zr, Hf, V, Nb and Ta are effective as the metal film.

Figure 13:
FIG. 13 is a cross-sectional view of the fifth wall structure of the ion source shown in FIG. 7.
Figure 14:
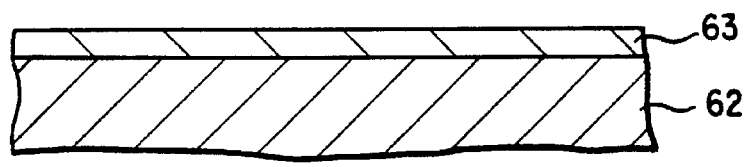
FIG. 14 is a cross-sectional view of the sixth wall structure of the ion source shown in FIG. 7.

In the first embodiment of the present invention, as shown in FIG. 13, no molybdenum is used, but a metal material whose principal ingredient is a Va-family metal can be solely employed. To cover the surface of the film 62 with a nitride 63, as shown in FIG. 14, is also effective in suppressing chemical etching due to halogen. In this case, the foregoing reaction preventing layer is not needed.

According to the first embodiment described above, no etching occurs in the arc chamber 51 due to ions such as fluoride and radicals or no foreign substances are attached to the tungsten filament 57. The filament 57 becomes fine in its entirety and is finally disconnected. The lifetime of the filament 57 is greatly lengthened to about 20 days, whereas that of the prior art filament is only three days.

Further, according to the first embodiment of the present invention, it is possible to prevent molybdenum cross-contamination when $BF_2^+$ ions are implanted. The mass number of bivalent ions of molybdenum (98/2=49) is the same as that of the $BF_2^+$ ions. In the conventional arc chamber the main ingredient of which is molybdenum, there occurs contamination of 10 to 1000 ppm in the ion implantation. In the present invention, however, no molybdenum is mixed into the ions to be implanted; therefore, the electrical characteristics of the device are not influenced by the contamination, and the ion implantation can cleanly be achieved.

Second Embodiment

Figure 15:
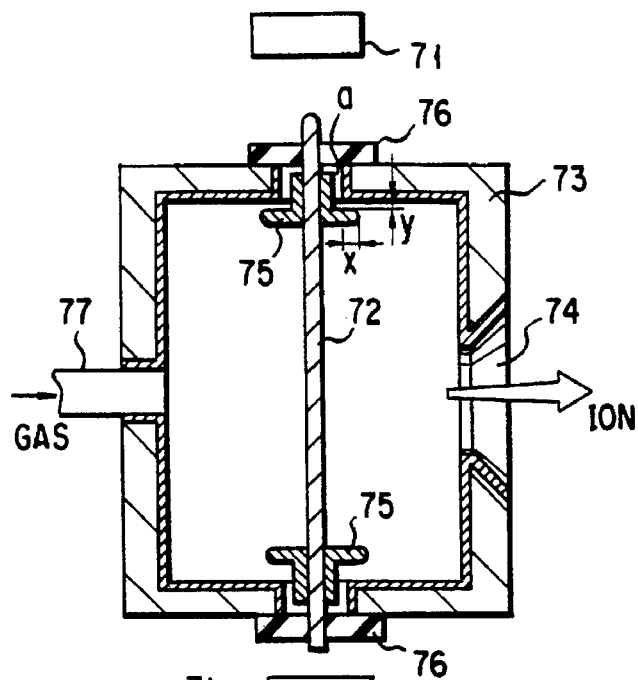
FIG. 15 is a cross-sectional view showing the constitution of a Freeman type ion source (ion generation device) according to a second embodiment of the present invention.

FIG. 15 illustrates an example of a Freeman type ion source (ion generation device) according to the second embodiment of the present invention.

According to the second embodiment, a chamber 73 is constituted of Mo and whose inner wall exposed by plasma is coated with Nb. The chamber 73 is so formed that a width is 7 cm, a height is 4 cm, and a depth is 4 cm, for example. A filament 72 has about 2 mm diameter and is constituted of W which is commonly-used. Two electromagnets 71 are provided near the both sides of the filament 72. Insulation supporting members 76 are provided for the purpose of effecting insulation between the filament 72 and the chamber 73 and thereby effectively generating plasma. Further, the ion source has an opening 77 for introducing gas on one side thereof and a slit 74 for irradiating ions on the other side thereof.

$GeF_4$ gas is supplied from the opening 77 the to ion source, with the result that thermoelectrons are emitted from the filament 72. Next, $GeF_4$ gas is discharged and ionized in the chamber 73. Ge ions generated by ionization are guided to a direction making right angles to the bar-shaped filament 72 through the slit 74, thereby converged on the face of a sample (not shown) by an ion beam apparatus or the like.

According to this second embodiment, since Nb which is chemically resistant to F ions and F radicals is coated on the inner wall of the chamber 73 exposed to plasma, the F ions and F radicals never etch the inner wall.

Accordingly, it is not considered that the metal is removed from the inner wall and absorbs on the filament 72 or the supporting insulation members 76, and therefore the lowering in resistance of the filament 72, the defect in insulation between the filament 72 and the chamber 73, and the contamination of the semiconductor substrate can be eliminated.

Moreover, each reflector (spacer) 75 expands to a direction vertical to the filament 72 and to a direction along the inner wall of the chamber 73. The spacer 75 is made of Mo, W, or the like. More preferably, V, Nb, Ta, Cr, Ti, Zr, Hf, Pt, or the like may be used as the material of the spacer 75. The supporting insulation members 76 are attached to the chamber 73 from outside thereof. With this construction, narrow space "a" between the chamber 73 and the spacer 75 is hold, thereby preventing the supporting insulation member 76 from being exposed to the plasma.

Assume that a length of the spacer 75 expanding from a surface of the inner wall vertical to the supporting insulation member 76 to a direction vertical to the filament 72 is "x", and a distance between the expanding spacer 75 and an inner wall of the chamber 73 is "y". Then, it is desirable to construct the ion source so that a relation "x/y>1" is established.

With this construction, not only the supporting insulation members 76 are not directly exposed to the plasma, but also F ions and F radicals move randomly in the chamber 73, which is caused by conflict with the inner wall and separation due to ionization. In this manner, invasion of F ions and F radicals to the supporting insulation members 76 is suppressed. Therefore, it can be realized that absorption of the filament material onto the supporting insulation members 76 caused by removal of the filament 72 itself is suppressed.

In this second embodiment, "x" is set at a value between 3 mm and 4 mm and "y" is set at a value between 2 mm and 3 mm. The relation "x/y>1" should be established, as described above. With this condition, it is thought that electrical short may occurs by absorption of the removed metal onto the portion around the narrow space "a"; however such a problem never arise because the ion source is constructed so that metal removal is suppressed.

With these effects, it is capable of lengthening the lifetime of the ion source and preventing a sample from being contaminated.

Figure 16:
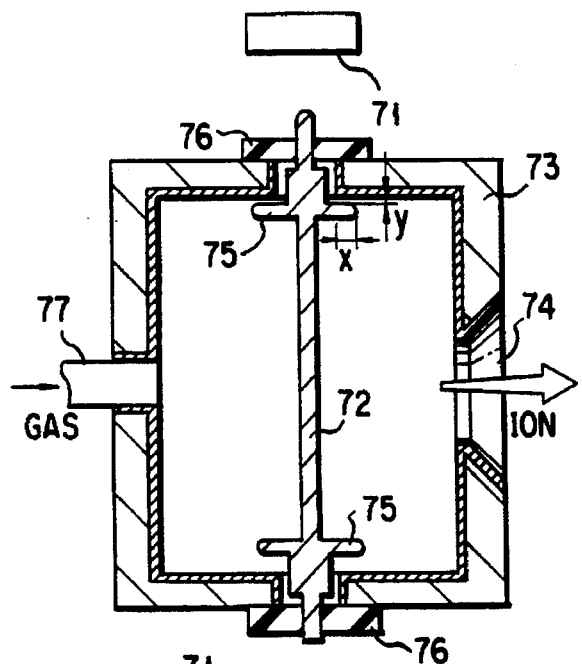
FIG. 16 is a cross-sectional view showing another constitution of a Freeman type ion source which is different from that in FIG. 15.

FIG. 16 is a cross-sectional view showing another constitution of a Freeman type ion source which is different from that in FIG. 15. As shown in FIG. 16, spacers 75 and a filament 72 are formed integrally as one component. With this construction, the constitution of the ion source is simplified, and therefore troubles in mechanism does not occur. Further, this makes easy to manufacture the ion source and makes lower the cost for manufacturing thereof.

Figure 17:
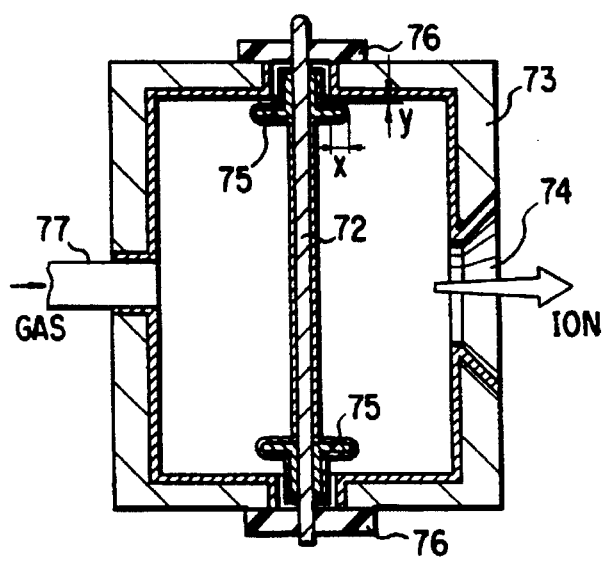
FIG. 17 is a cross-sectional view showing still another constitution of a Freeman type ion source which is different from that in FIG. 15.

FIG. 17 is a cross-sectional view showing still another constitution of a Freeman type ion source which is different from that in FIG. 15. As shown in FIG. 17, Nb is coated not only on the inner wall of the chamber 73 but also on the spacers 75 and the filament 72.

There may be used at least one of the metals used in the case of the wall of the ion source, other than Nb. Further, the filament 72 may be constituted of at least one of the metals used in the case of the wall of the ion source. In the case where the same type of metal is used for each of the inner wall, the spacers 75, and the filament 72, the manufacturing for the ion source may become easy and its cost may be lowered. It is possible to use different types of metals for each of the inner wall, the spacers 75, and the filament 72.

It should be noted that the present invention is applicable to the case where only one of the spacers 75 and the filament 72 is coated with Nb.

With this construction, it is capable of suppressing the removal of the spacers 75 and the filament 72 itself. Therefore, this makes more hard to cause the defect in insulation and the reliability of the ion source is enhanced.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

In the present invention, for example, the gas or vapor to be ionized is not limited to $BF_3$ or $GeF_4$, and the filament is not limited to tungsten.

The present invention is more effective when it is applied to a Freeman ion source or a Bernas ion source using a filament; however, it is not limited to an ion source using a filament but can be applied to all ionization type devices.

The present invention can be applied to an ion irradiation device as well as the ion source (ion generation device). Moreover, the film forming and etching processes can be executed using the ions generated by the method described above.

Further, the present invention can be applied to a semiconductor device and a method of manufacturing the same. For example, an impurity diffusion layer such as source and drain regions of a MOSFET can be formed by adding impurities such as boron (B) and phosphorus (P) to a semiconductor substrate, or a contact resistance to a diffusion layer can be lowered by implanting Ge ions into a silicon substrate. In an n-type conductivity MOSFET formed on a SOI (Silicon On Insulator) substrate, a semiconductor layer with a small band gap can be formed on a source region to easily suppress a degradation in transistor characteristics due to accumulation of holes at the end of the source region while preventing impurities from being mixed thereinto.

As described in detail above, according to the present invention, since the inner wall of a chamber is coated with metal having a resistance to chemical etching due to ions or radicals, a stable ion-implanting operation can be performed for a long time.

If a barrier metal is provided between a chamber and metal coated on the inner wall of the chamber or a nitride of the coated metal is coated on the surface of the coated metal, a stable ion-implanting operation can be carried out for a longer time.

What is claimed is:

1. An ion irradiation method comprising the steps of:
   providing a chamber capable of generating plasma therein, an inner wall of said chamber being formed of a metal which is resistant to chemical etching due to ions and radicals;
   providing a sample in a sample chamber outside said chamber;
   introducing gas into said chamber from a first opening of said chamber;
   generating ions from the introduced gas by plasma generated in said chamber;
   emitting the ions from a second opening of said chamber; and
   irradiating the emitted ions onto the sample in said chamber.

2. The method according to claim 1, wherein the step of irradiating ions includes the step of forming a film on the sample by the ion irradiation.

3. The method according to claim 1, wherein the step of irradiating ions includes the step of etching the sample by the ion irradiation.

4. The method according to claim 1, wherein the sample includes a semiconductor substrate.

5. The method according to claim 4, wherein the step of irradiating ions includes the step of forming an impurity diffusion layer in the substrate by the ion irradiation.

6. The method according to claim 5, wherein the impurity diffusion layer constitutes source and drain regions of a MOSFET (metal oxide semiconductor field effect transistor).

7. The method according to claim 6, wherein the step of irradiating ions includes the step of forming a semiconductor layer on the source and/or drain region of the MOSFET.

8. The method according to claim 5, wherein the step of irradiating ions includes the step of implanting Ge ions into the substrate such that a contact resistance to the diffusion layer can be lowered.

9. The method according to claim 1, wherein said gas is a compound including halogen.

10. The method according to claim 9, wherein said gas is at least one of $GeF_4$, $SiF_4$, $BF_3$, $PF_3$, and $AsF_3$.

11. The method according to claim 1, wherein a filament is provided in said chamber, and the plasma is generated by emitting thermoelectrons using said filament.

12. The method according to claim 11, wherein a surface of said filament is formed of a metal which is resistant to chemical etching by the ions and radicals.

13. The method according to claim 11, wherein a supporting insulation member for supporting said filament is used, said supporting insulation member being separated from a generation area of the plasma.

14. The method according to claim 13, wherein a spacer between said supporting insulation member and said filament is provided, and said supporting insulation member is separated from the generation area of the plasma by leaving a space between said spacer and at least one of said filament and said inner wall of the chamber.

15. The method according to claim 11, wherein a compound of said metal and halogen has a vapor pressure which is lower than that of a compound of said filament and halogen.

16. The method according to claim 1, wherein said metal has a melting point which is higher than an inside temperature of said chamber.

17. The method according to claim 1, wherein said metal contains at least one of V, Nb, Ta, Cr, Ti, Zr, Hf and Pt as a principal ingredient.

18. The method according to claim 1, wherein said chamber includes molybdenum and said gas includes fluorine.

19. The method according to claim 18, wherein a compound of said metal and fluorine has a vapor pressure which is lower than that of $MoF_6$.

20. The method according to claim 1, wherein said inner wall of said chamber is coated with said metal.

21. The method according to claim 1, wherein said metal contains at least one of V, Nb and Ta as a principal ingredient.

22. The method according to claim 1, wherein a barrier metal between said chamber and said metal is provided to prevent a material of said chamber from being seeped from a surface of said metal.

23. The method according to claim 1, wherein the surface of said metal is coated with nitride of said metal.

* * * * *